United States Patent [19]
Dietrich

[11] Patent Number: 5,148,130
[45] Date of Patent: Sep. 15, 1992

[54] WIDEBAND MICROSTRIP UHF BALUN

[76] Inventor: James L. Dietrich, 1642 N. Baltimore Ave., Derby, Kans. 67037

[21] Appl. No.: 534,548

[22] Filed: Jun. 7, 1990

[51] Int. Cl.$^5$ .......................... H03H 7/42; H01P 5/10
[52] U.S. Cl. ......................................... 333/25; 333/26
[58] Field of Search ............... 333/117, 118, 120, 124, 333/128, 136, 25, 26, 138, 156, 161; 343/859

[56] References Cited

U.S. PATENT DOCUMENTS

| | | |
|---|---|---|
| 2,445,895 | 7/1948 | Tyrrell . |
| 2,639,325 | 5/1953 | Lewis .................................... 333/120 |
| 2,771,518 | 11/1956 | Sziklai ............................. 333/132 X |
| 3,357,023 | 12/1967 | Hemmie . |
| 3,523,260 | 8/1970 | Gunshinan et al. .................... 333/26 |
| 3,656,071 | 4/1972 | Woodward ........................... 333/26 |
| 3,678,418 | 7/1972 | Woodward ........................... 333/26 |
| 3,784,933 | 1/1974 | Scherer et al. ....................... 333/26 |
| 3,846,721 | 11/1974 | Fritz et al. ............................ 333/26 |
| 4,160,210 | 7/1979 | Molinari . |
| 4,460,877 | 7/1984 | Sterns .................................. 333/26 |
| 4,725,792 | 2/1988 | Lampe, Jr. ........................... 333/26 |
| 4,857,869 | 8/1989 | Terakawa et al. .............. 343/859 X |
| 4,992,761 | 2/1991 | Seely et al. ......................... 333/118 |
| 5,023,576 | 6/1991 | Staudinger et al. ................ 333/118 |
| 5,045,821 | 9/1991 | Staudinger et al. ................ 333/118 |

OTHER PUBLICATIONS

R. C. Johnson et al., Antenna Engineering Handbook, McGraw-Hill, 2d Ed., 1984, Sec. 43-6, pp. 43-3 to 43-27.

Primary Examiner—Paul Gensler
Attorney, Agent, or Firm—Litman, McMahon & Brown

[57] ABSTRACT

A wideband balun for converting between unbalanced and balanced signals and impedances utilizes two single-ended networks connected in parallel at the unbalanced side. The networks provide equal power split and equal phase slopes with midband phase shifts of +90 and −90 degrees in order to give equal-amplitude, anti-phase balanced outputs over an octave or more bandwidth. Printed circuits construction including a folded microstrip line provides an effective implementation at UHF frequencies.

16 Claims, 4 Drawing Sheets

WIDEBAND MICROSTRIP UHF BALUN

BACKGROUND OF THE INVENTION

The present invention relates to an impedance matching balun device for coupling an unbalanced transmission line or circuit to either a balanced transmission line or a balanced antenna. A balun, or balanced-to-unbalanced circuit, performs the function of coupling an unbalanced source to a balanced load by providing at the load terminals two signals of approximately equal amplitude and 180° phase difference. Other generally desirable electrical properties are a good input impedance match, low dissipation loss, and flat amplitude and group delay characteristics. The useful frequency bandwidth of a balun is that over which all the above performance factors are satisfied to a specified degree. Implementation of this device may be carried out by a number of well-known methods. Such basic forms are given in Sec. 43-6 of the text *Antenna Engineering Handbook*, Richard C. Johnson and Henry Jasik, editors, McGraw-Hill, 1984 (Second Edition).

For application in UHF television reception in the frequency range 470–806 MHz, a balun is used to connect a 300-ohm balanced antenna to a 75-ohm unbalanced coaxial cable or amplifier. It is also used to connect 75-ohm cable to the 300-ohm balanced input of the television receiver. The most usual form in present use is the bifilar, transmission line type wound on a ferrite core. These devices at best introduce a loss of 1-2 dB and a mismatch in the 1.5 to 2.0 VSWR (voltage standing-wave ratio) range. In some cases the performance is much worse owing to the difficulty and inconsistent methods of manufacture, wiring, and parts placement. These component deficiencies tend to degrade the receiving system performance and, hence, lessen the overall quality of the UHF television service.

Another known form is disclosed in U.S. Pat. No. 4,160,210 to Molinari. Here a half-wavelength folded microstrip transmission line provides the necessary 180° phase differential at the balanced output. However, as the signal frequency departs from the center design frequency, a phase error results. For the UHF television band, this error is substantial at the band edges, amounting to ±47.4°.

Another recent example of a balun is shown in U.S. Pat. No. 4,725,792 to Lampe, Jr. The phase error of a half-wavelength line is compensated by a network comprising quarter-wavelength line sections. The bandwidth given for a 4:1 impedance ratio, however, is 20% or somewhat less than required for UHF television. In addition, the size of the circuit becomes rather large and bulky at UHF frequencies in this and other examples which require the use of quarter-wavelength or greater transmission line sections.

OBJECTS OF THE INVENTION

With regard to the state of the art of baluns, it is a general objective of the present invention to provide a balun with improved electrical characteristics of low insertion loss, good input impedance match, good amplitude and phase balance, and flat amplitude and group delay response.

Another object is to provide a balun that will function satisfactorily over a wide frequency bandwidth of an octave or more.

A further object is to provide a balun that is of small size at UHF frequencies, simple and economical to manufacture, and of such construction so as to be readily integrated into conventional receiving circuit forms.

SUMMARY OF THE INVENTION

The present invention comprises two single-ended networks connected in parallel which divide unbalanced input signal energy equally and introduce an approximate phase shift at the band center frequency of +90° through one network and −90° through the second network. The balanced output signal is taken between the outputs of the two networks where the phase difference is 180°. An equal phase slope of both networks about the band center frequency maintains the 180° phase difference with small error over a useful bandwidth of an octave or more. The device is reciprocal and operates equally well with the balanced port as signal input and the unbalanced port as signal output.

Other objects, features, and advantages of this invention and a more complete understanding thereof will become apparent from the following description taken in conjunction with the accompanying drawings wherein are set forth, by way of illustration and example, certain embodiments of this invention.

The drawings constitute a part of this specification and include exemplary embodiments of the present invention and illustrate various objects and features thereof.

DETAILED DESCRIPTION OF THE INVENTION

Figure 1:
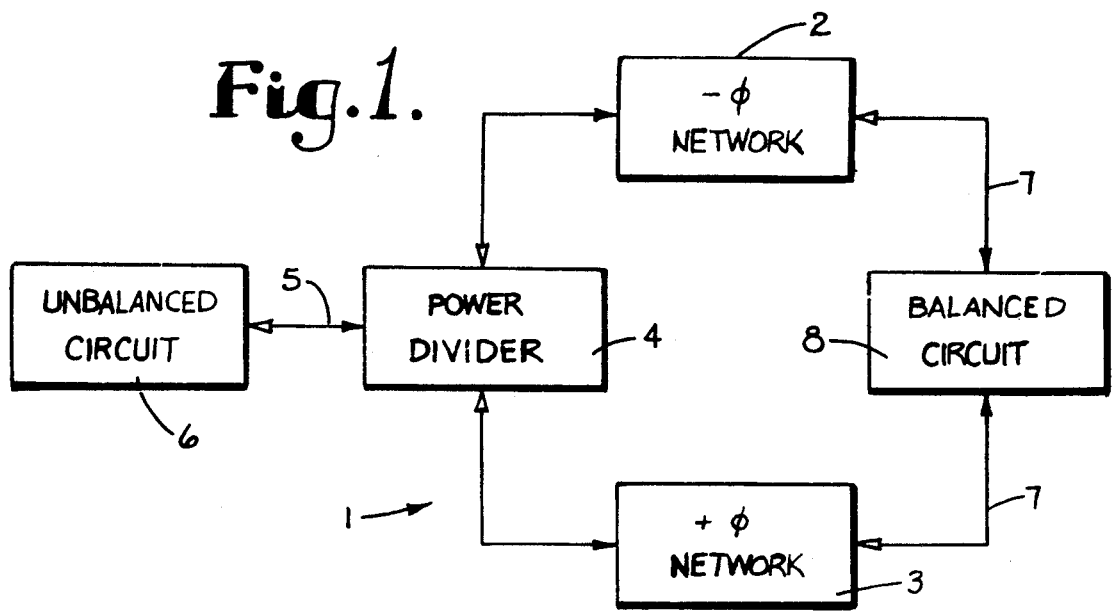
FIG. 1 is a block diagram illustrating principal components of a balun embodying the present invention.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

Referring to the drawings in more detail:

The reference numeral 1 generally designates a balun device embodying the present invention. As illustrated in FIG. 1, the balun 1 generally includes a negative phase shift network 2 and a positive phase shift network 3 connected by a power divider 4. The power divider 4 connects the networks 2 and 3 to an unbalanced port 5 which is illustrated as connected to an unbalanced circuit 6. In addition, input energy is divided equally between the two networks by the power divider 4. Opposite ends of the networks 2 and 3 from the power divider 4 form a balanced port 7 to which is connected a balanced network 8. In general, the balun 1 matches an unbalanced signal from the unbalanced circuit 6 to a balanced circuit 8 (indicated by the filled arrow heads in FIG. 1) or, conversely, matches a balanced signal from the balanced circuit 8 to an unbalanced circuit 6 (indicated by the open arrow heads in FIG. 1).

Figure 2:
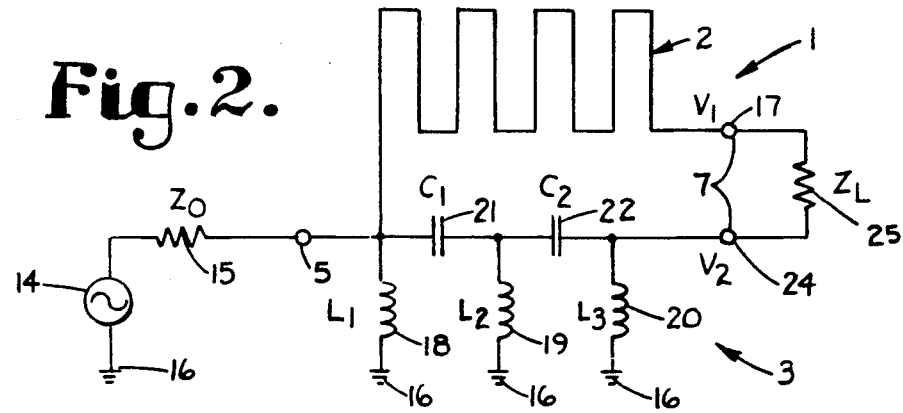
FIG. 2 is a schematic diagram of the balun of the present invention with a signal source, source impedance, and load impedance shown connected thereto.

A preferred embodiment of the balun 1 is shown schematically in FIG. 2 with a signal source 14 and associated source impedance 15 of value $Z_0$ connected between the unbalanced input 5 and a ground 16. The negative phase shift network 2 has an input electrically connected to unbalanced input 5 and has an output signal $V_1$ at output 17 thereof, as referenced to ground 16. Inductors 18, 19, and 20 and capacitors 21 and 22 comprise positive phase shift network 3 with an input electrically connected to unbalanced input 5 and with, an output signal $V_2$ at an output 24, as referenced to ground 16. Output 17 and output 24 comprise the balanced output 7 of the balun 1 across which is connected a load impedance 25 of value $Z_L$.

When each output 17 and 24 is terminated with an impedance of $Z_L/2$, negative phase shift network 2 and positive phase shift network 3 have an input impedance of $2Z_0$ thereby providing an input impedance of $Z_0$ when connected in parallel. The power divider 4 of FIG. 1 is thereby effected providing equal power to the two networks 2 and 3 so that the magnitude of the respective output voltages at the terminating impedances of $Z_L/2$ are equal. Furthermore, the positive phase shift network 3 has phase shift $\phi_2$, and the negative phase shift network 2 has phase shift $\phi_1$. (Throughout the specification and claims, the symbol "$\phi$" is used to indicate the Greek letter "phi" to represent electrical phase.) The phase difference $\phi_2 - \phi_1$ is 180°. Under the above conditions, the networks 2 and 3 connected to form balun 1 as shown in FIG. 2 result in the balanced output condition, $V_2 = -V_1$ in which case the load impedance 25 of value $Z_L$ connected to balanced output 7 is functionally equivalent to the above specified terminations of impedance $Z_L/2$ connected from output 17 to ground 16 and from output 24 to ground 16.

The illustrated negative phase shift network 2 is designed as a linear phase network having phase shift characteristic:

$$\phi_1 = -k_1 f \quad (1)$$

The positive phase shift network 3 is derived from a linear phase prototype and has phase shift characteristic:

$$\phi_2 = k_2/f \quad (2)$$

The design of networks 2 and 3 is readily accomplished using well-known network synthesis techniques. In the above equations, f is the frequency normalized to the lower frequency edge of the desired operating and. Throughout the following text, normalized frequencies will be referred to unless qualified by a frequency unit (Hertz). If the quantity x is defined as the ratio of upper frequency edge to lower frequency edge of the desired operating band, then in order to achieve minimum phase error of the antiphase output condition over the desired operating band, design constants $k_1$ and $k_2$ are selected as:

$$k_1 = 360°/(x^{\frac{1}{2}} + 1)^2 \quad (3)$$

$$k_2 = x k_1 \quad (4)$$

In this case, the maximum phase error over the operating band is:

$$\phi_{ERR} = 180°[(x^{\frac{1}{2}} - 1)/(x^{\frac{1}{2}} + 1)]^2 \quad (5)$$

and occurs at the band edge frequencies f=1, f=x and the intermediate frequency $f = x^{\frac{1}{2}}$. Zero phase error occurs at the two frequencies: $f = q \pm (q^2 - x)^{\frac{1}{2}}$, where $q = 90°/k_1$.

Figure 5:
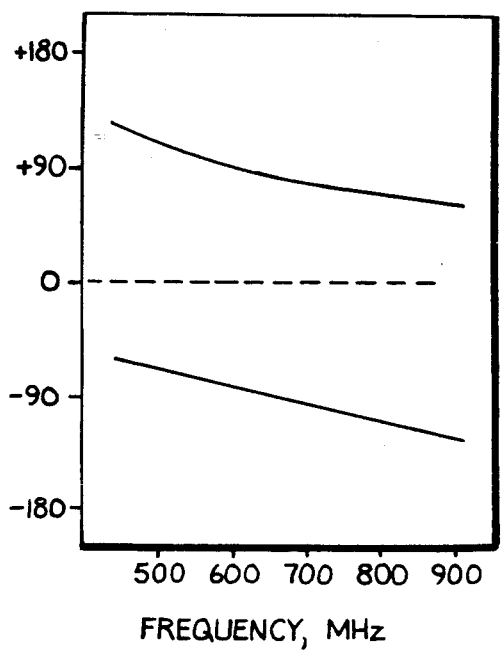
FIG. 5 is a graph showing phase shift vs. frequency for the two networks comprising the balun.

FIG. 5 illustrates the operating principle in achieving the antiphase output condition over the octave band 450–900 MHz. The network phase shifts are plotted using equations (1) and (2) where the design parameters are x=2, $k_1 = 61.8°$ and $k_2 = 123.5°$. The midband phase shifts are approximately ±90° and the overall phase slopes are equal in order to maintain approximately constant phase differential.

Figure 6:
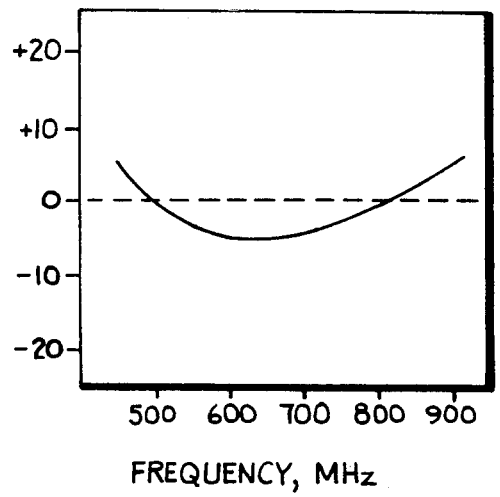
FIG. 6 is a graph showing the phase error vs. frequency of the two networks comprising the balun.

The phase error from the desired 180° phase differential is $\phi_e = \phi_2 - \phi_1 - 180°$ and is plotted in FIG. 6. The maximum error is ±5.3° and occurs at the band edges and $(2^{\frac{1}{2}})450$ MHz = 636.4 MHz. Zero-error crossings are at 498 MHz and 814 MHz.

The group delay is approximately constant over the operating band since the $\phi_2$ curve tracks the linear $\phi_1$ phase characteristic to within 5.3°. The group delay for the present example is 0.38 ns. For other bandwidths and frequencies it may be calculated by $$t_{gd} = [(x^{\frac{1}{2}} + 1)^2 f_1]^{-1} \quad (6)$$

where $f_1$ is the actual, de-normalized lower band edge frequency.

Figure 3:
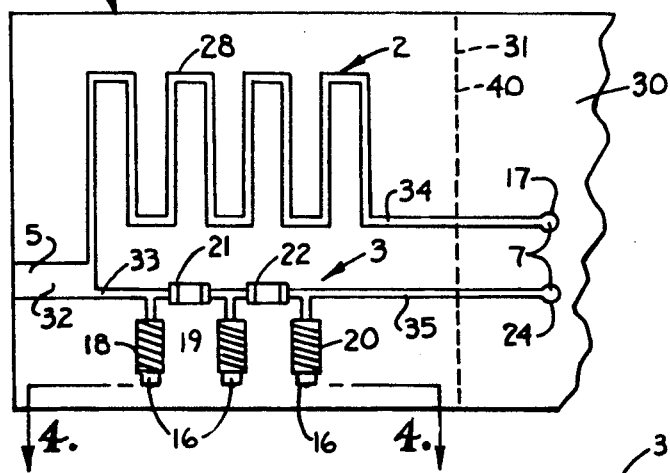
FIG. 3 is a top plan view of dielectric substrate with conductive traces and components implementing a microstrip embodiment of the balun of the present invention.
Figure 4:
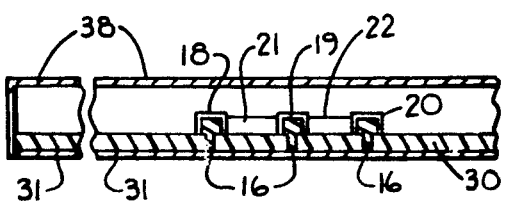
FIG. 4 is an enlarged cross sectional view taken on line 4—4 of FIG. 3 and illustrates a ground conductor of the microstrip balun and connections thereto including a shield for the balun.

A microstrip embodiment of the balun 1 of FIG. 2 is shown in FIGS. 3 and 4 for most effective operation in the UHF frequency band 470–806 MHz. The balanced-to-unbalanced impedance transformation ratio is 4.1, that is $Z_L = 4Z_0$. A dielectric substrate 30 has ground conductor layer 31 applied to the complete lower surface. The upper surface of dielectric substrate 30 contains conductive microstrip lines and components comprising balun 1. The unbalanced input 5 is at the left edge of an illustrated input line 32. A line 33 connects the input of positive phase shift network 3 to the right side (as viewed in FIG. 3) of input line 32 and to the input of delay line 28. Output 17 is the right edge of a line 34 which connects to the output of delay line 28, while output 24 is the right edge of line 35 which connects to the output of positive phase shift network 3. The balanced output 7 is taken between output 17 and output 24. The characteristic impedance of delay line 28 and lines 33, 34, and 35 is $2Z_O$. The characteristic impedance of input line 32 is $Z_O$. Components 18-22 are arranged to make the electrical connections shown in the schematic representation of FIG. 2. Grounds 16 for components 18-20 are made by connection through substrate 30 to ground conductor 31, as shown in FIG. 4.

Using G-10 glass-epoxy material of thickness 60 mils for dielectric substrate 30 and designing for $Z_0=50$ ohms, the width of line 32 is 132 mils; the width for lines 33, 34, and 35 is 32 mils; and the width for delay line 28 is 20 mils. The delay line 28 is a microstrip line that has been folded to save space and provide a smaller size. The spacing between each folded section is 125 mils. The overall electrical length of delay line 28 plus line 34 less the combined electrical length of line 33 and line 35 is approximately 73° at 470 MHz. The values of components 18-22 22 for the positive phase shift network 3 are as follows:

| |
|---|
| $C_1$ = 3.9 pF |
| $C_2$ = 3.9 pF |
| $L_1$ = 68 nH |
| $L_2$ = 33 nH |
| $L_3$ = 68 nH |

Figure 7:
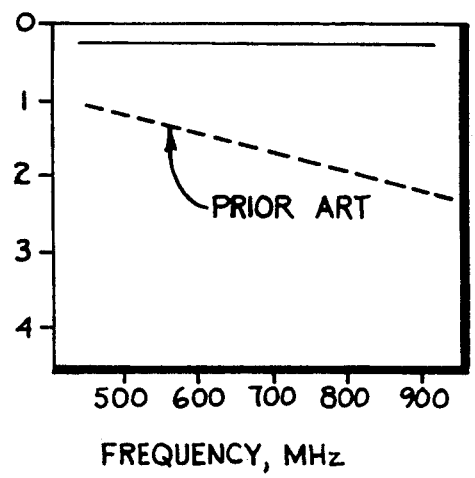
FIG. 7 is a graph showing measured insertion loss vs. frequency for the balun of the present invention compared to that of a conventional balun.
Figure 8:
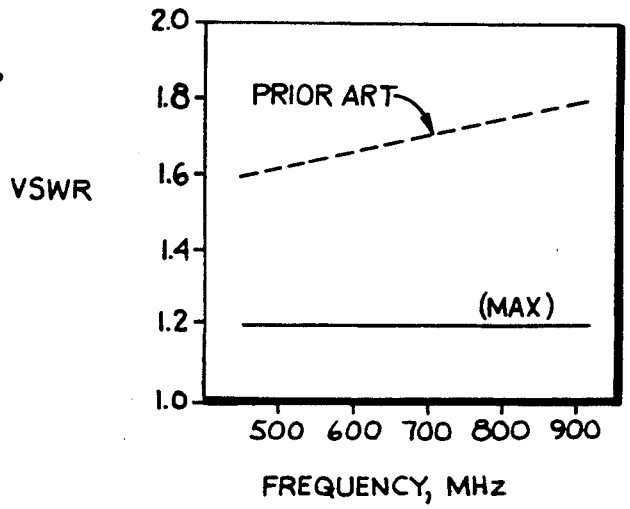
FIG. 8 is a graph showing measured VSWR vs. frequency for the balun of the present invention compared to that of a conventional balun.
Figure 9:
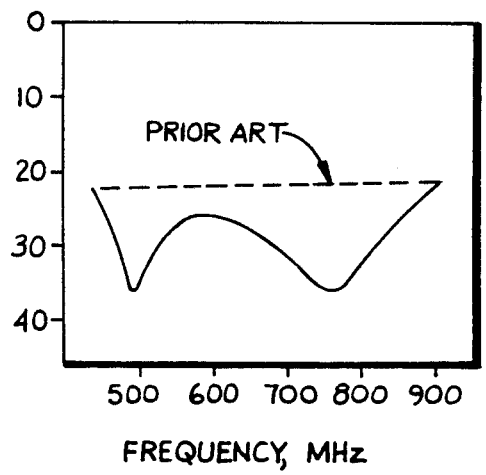
FIG. 9 is a graph showing measured common-mode decoupling vs. frequency at the balanced output of the balun of the present invention compared to that of a conventional balun.

Measured electrical performance is shown in FIGS. 7-9 comparing the present microstrip embodiment to a conventional ferrite balun/matching transformer device. FIG. 7 shows insertion loss to be 0.25 dB and constant over the frequency range, much improvement over the ferrite device. Loss is approximately equal in the delay line 28 and positive phase shift network 3 and even lower loss may be obtained by the use of better dielectric material for substrate 30 and better inductor components 18-20. Improved input matching is shown in FIG. 8 with a VSWR (voltage standing-wave ratio) less than 1.2. Further improvement is possible with careful adjustment, and inherent performance is not limited to the VSWR obtained presently.

The most basic balun function of common-mode decoupling is shown in FIG. 9 to be greater than 27 dB over the 470-806 MHz frequency band and represents an improvement over that entire range to the prior art decoupling. In terms of amplitude and phase error at the balanced output 7, decoupling is expressed by $$C_{dB} = 10 \log 2[1 - 2a \cos \phi_e/(1+a^2)]^{-1} \quad (7)$$

where amplitude ratio $a = abs(V_2/V_1)$ or $abs(V_1/V_2)$; amplitude error in dB is $abs(20 \log a)$; $abs(\ )$ indicates absolute value; and phase error $\phi_e = \phi_2 - \phi_1 - 180°$.

Figure 10:
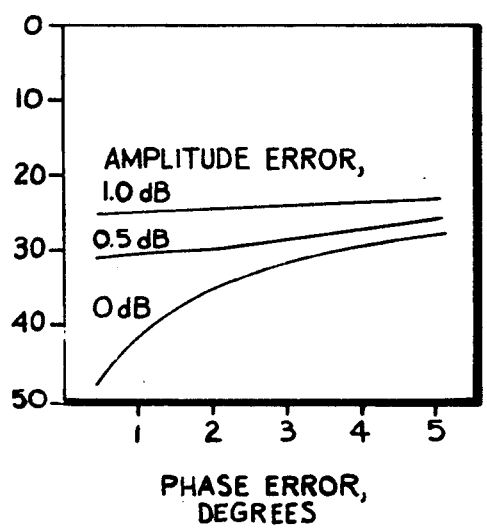
FIG. 10 is a graph showing common-mode decoupling vs. phase error for balun devices generally for different values of amplitude error.

Equation (7) compares on an equal power basis the sum of output voltages $V_1 + V_2$ of the balanced mode, with approximately equal and anti-phase outputs, to the common mode with equal, in-phase outputs. It is plotted in FIG. 10 with decoupling in terms of phase error for varying degrees of amplitude error. The amplitude and phase error for the measured device may be inferred from FIG. 9 by noting that the two points of maximum value 36 dB are due to amplitude error only of 0.28 dB. By equation (7), this assumed constant amplitude error and a maximum phase error of 4.8° produce the 27 dB minimum measured decoupling. Thus, the common-mode decoupling measurement in particular demonstrates well the correct operation of the present microstrip embodiment.

The microstrip balun 1 of FIGS. 3 and 4 is readily manufactured using conventional printed circuit photo etching methods and efficient automated placement and attachment of components 18-22 to the printed circuit board. Benefits derived are low cost and consistent performance. The microstrip embodiment described is especially suitable for use with other circuits such as an amplifier or tuner because they are very often of similar construction and so may be combined with the balun 1 into a single, integrated unit. The position of the unbalanced input 5 and the balanced output 7 on opposing sides simplifies the addition of associated circuitry or connectors and provides good isolation between these signals and circuits. Further utility is achieved with the single-ended, microstrip construction in that performance is not disturbed by objects in close proximity, thereby making a shield unnecessary. If shielding is desired, tests with a shield cover 38 (FIG. 4) as close as ¼ inch above the circuit side of substrate 30 show no significant change in operation.

Referring to FIG. 3, the substrate 30 may be an individually manufactured component or may be manufactured as a portion of a larger circuit board having other components (not shown) thereon. In either case, it may be desirable to operate a balanced circuit portion without ground. If so, ground conductor layer 31 is terminated by a margin (indicated by broken line 40) beneath the balanced output lines 34 and 35 with the output terminals 17 and 24 on an opposite side of the margin 40 from the remainder of the balun 1. The portions of lines 34 and 35 located on this opposite side together form a balanced transmission line. Alternatively, the single-ended nature of each of the balanced output lines 34 and 35 may be maintained by extending the margin 40 of the ground conductor layer 31 to the balanced port terminals 17 and 24.

Figure 11:
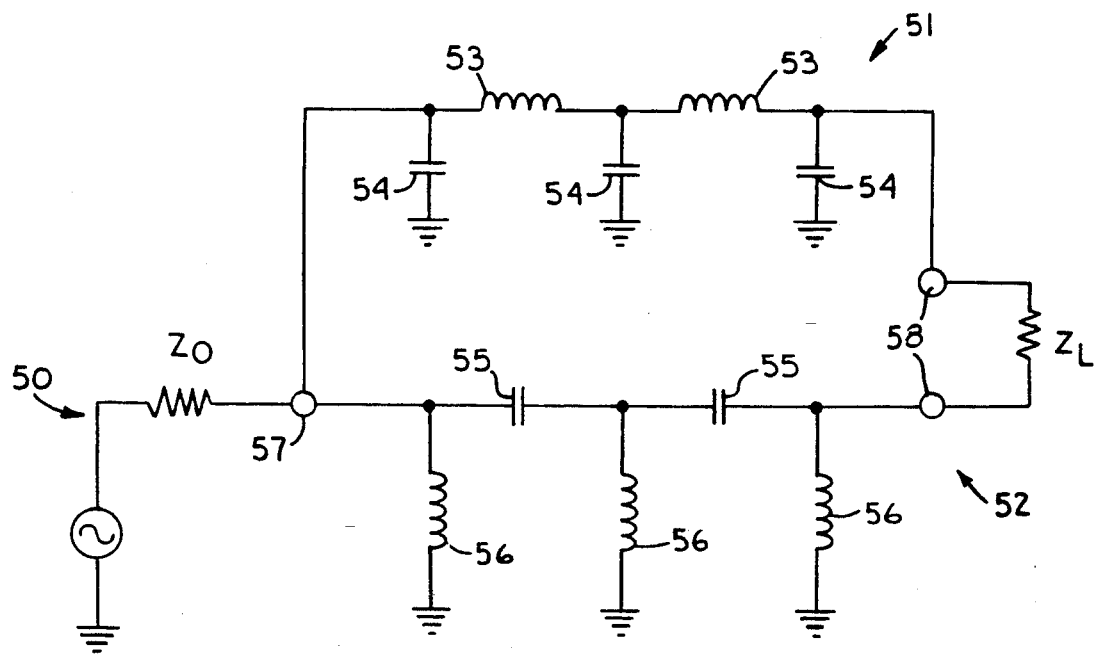
FIG. 11 is a schematic diagram illustrating a balun according to the present invention which incorporates a lumped element ladder network as a negative phase shift network along with a complementary ladder network as a positive phase shift network.

FIG. 11 illustrates a modified embodiment 50 of the balun according to the present invention which incorporates a negative phase shift network 51 implemented as a lumped element ladder network along with a positive phase shift network 52 similarly implemented as a lumped element ladder network. The negative phase shift network 51 is formed by alternately connected series inductors 53 and parallel capacitors 54. The positive phase shift network 52 is formed similar to the network 3 of the balun 1 with series capacitors 55 and parallel inductors 56. One end each of the networks 51 and 52 are coupled or connected to define an unbalanced port 57. The uncoupled ends of the network 51 and 52 define a balanced port 58.

It is to be understood that while certain forms of the present invention have been illustrated and described herein, it is not to be limited to the specific forms or arrangement of parts described and shown.

What is claimed and desired to be secured by Letters Patent is as follows:

1. A balun for converting between unbalanced and balanced signals over a selected operating band and comprising:

(a) a positive phase shift network causing a phase shift between opposite ends of said positive network of substantially +90° at a band center of said operating band;
(b) a negative phase shift network causing a phase shift between opposite ends of said negative network of substantially -90° at said band center;
(c) said networks being coupled at one end of each to form an unbalanced port;
(d) opposite ends respectively of said networks forming a balanced port thereacross; and
(e) said networks being configured to have substantially linear phase shift variations through said operating band in which said operating band is in excess of an octave whereby a substantially constant phase differential occurs between respective ends of said networks over said operating band.

2. A balun having an unbalanced port and a balanced port with first and second terminals, said balun for converting between unbalanced and balanced signals over an operating frequency band and comprising:
(a) a first network having an input and an output and being a negative phase shift network;
(b) a second network having an input and an output and being a positive phase shift network;
(c) said inputs of said first network and said second network being coupled to form said unbalanced port;
(d) said outputs of said first network and said second network forming said first and second terminals respectively of said balanced port;
(e) said first network having a phase shift from input to output which is substantially −90° at a center frequency of said operating frequency band;
(f) said second network having a phase shift from input to output which is substantially +90° at said center frequency; and
(g) said second network having a phase characteristic from input to output described substantially by $\phi_2 = k_2/f$ over said operating frequency band, wherein $k_2$ is a design constant for said second network, which is selected to cause said second network and said first network to provide a substantially constant phase differential over said operating band, and f is signal frequency normalized to a lower frequency edge of said operating frequency band.

3. A balun having an unbalanced port and a balanced port with first and second terminals, said balun for converting between unbalanced and balanced signals over an operating frequency band and comprising:
(a) a first network having an input and an output and being a negative phase shift network;
(b) a second network having an input and an output and being a positive phase shift network;
(c) said inputs of said first network and said second network being coupled to form said unbalanced port;
(d) said outputs of said first network and said second network forming said first and second terminals respectively of said balanced port;
(e) said first network having a phase shift from input to output which is substantially −90° at a center frequency of said operating frequency band;
(f) said second network having a phase shift from input to output which is substantially +90° at said center frequency;
(g) said first network having a phase characteristic from input to output described substantially by $\phi_1 = -k_1 f$ over said operating frequency band, wherein $k_1$ is a design constant for said first network and f is signal frequency normalized to a lower frequency edge of said operating frequency band; and
(h) said second network having a phase characteristic from input to output described substantially by $\phi_2 = k_2/f$ over said operating frequency band, wherein $k_2$ is a design constant for said second network.

4. A balun as set forth in claim 3 and including:
(a) a one-to-two, equal power, power dividing circuit having an input, a first output, and a second output; and
(b) said power dividing circuit coupling said inputs of said first and second networks respectively to said first and second outputs of said power dividing circuit whereby said input of said power dividing circuit form said unbalanced port.

5. A balun as set forth in claim 3 and including:
(a) an unbalanced transmission line connected to and extending from said unbalanced port.

6. A balun as set forth in claim 3 and including:
(a) a two-conductor balanced transmission line connected to and extending from said balanced port.

7. A balun as set forth in claim 3 and including:
(a) a first unbalanced transmission line connected to and extending from said first terminal of said balanced port; and
(b) a second unbalanced transmission line connected to and extending from said second terminal of said balanced port.

8. A balun as set forth in claim 3 wherein:
(a) said first network is a negative phase shift ladder network comprising alternately connected series inductors and parallel capacitors.

9. A balun as set forth in claim 3 wherein:
(a) said second network is a positive phase shift ladder network comprising alternately connected series capacitors and parallel inductors.

10. A balun having an unbalanced port and a balanced port with first and second terminals, said balun for converting between unbalanced and balanced signals over an operating frequency band and comprising:
(a) a first network having an input and an output;
(b) a second network having an input and an output;
(c) said inputs of said first network and said second network being coupled to form said unbalanced port;
(d) said outputs of said first network and said second network forming said first and second terminals respectively of said balanced port;
(e) said first network having a phase shift from input to output which is substantially −90° at a center frequency of said operating frequency band;
(f) said second network having a phase shift from input to output which is substantially +90° at said center frequency;
(g) said first network having a phase characteristic from input to output described substantially by $\phi_1 = -k_1 f$ over said operating frequency band, wherein $k_1$ is a design constant for said first network and f is a signal frequency normalized to a lower frequency edge of said operating frequency band;

(h) said second network having a phase characteristic from input to output described substantially by $\phi_2 k_2/f$ over said operating frequency band, wherein $k_2$ is a design constant for said second network;

(i) a balanced impedance of $Z_L$ connected to said balanced port being coupled and matched to an unbalanced impedance of $Z_0$ connected to said unbalanced port;

(j) an input conductance of said first network being equal to an input conductance of said second network when the output of said first network and the output of said second network are each terminated by an impedance of $Z_L/2$; and (k) an input impedance of said first network in parallel combination with an input impedance of said second network being equal to the complex conjugate of said unbalanced impedance $Z_0$ when the output of said first network and the output of said second network are each terminated by an impedance of $Z_L/2$.

11. A balun as set forth in claim 10 and including:

(a) a dielectric substrate having first and second opposed, substantially parallel surfaces;

(b) said first network and said second network being positioned upon said first surface of said substrate; and (c) a planar ground conductor disposed on said second surface of said substrate.

12. A balun as set forth in claim 11 wherein:

(a) said first network is a negative phase shift ladder network comprising alternately connected series inductors and parallel capacitors.

13. A balun as set forth in claim 11 wherein:

(a) said second network is a positive phase shift ladder network comprising alternately connected series capacitors and parallel inductors.

14. A balun as set forth in claim 11 and including:

(a) a conductive electromagnetically shielding cover placed above said first surface of said substrate and above said first and second networks; and (b) said cover being electrically connected to said ground conductor.

15. A balun having an unbalanced port and a balanced port with first and second terminals, said balun for converting between unbalanced and balanced signals over an operating frequency band and comprising:

(a) a first network having an input and an output;

(b) a second network having an input and an output;

(c) said inputs of said first network and said second network being coupled to form said unbalanced port;

(d) said outputs of said first network and said second network forming said first and second terminals respectively of said balanced port;

(e) said first network having a phase shift from input to output which is substantially $-90°$ at a center frequency of said operating frequency band;

(f) said second network having a phase shift from input to output which is substantially $+90°$ at said center frequency;

(g) said first network having a phase characteristic from input to output described substantially by $\phi_1 = -k_1 f$ over said operating frequency band, wherein $K_1$ is a design constant for said first network and f is signal frequency normalized to a lower frequency edge of said operating frequency band;

(h) said second network having a phase characteristic from input to output described substantially by $\phi_2 = k_2/f$ over said operating frequency band, wherein $k_2$ is a design constant for said second network;

(i) a balanced impedance of $Z_L$ connected to said balanced port being coupled and matched to an unbalanced impedance of $Z_0$ connected to said unbalanced port;

(j) an input conductance of said first network being equal to an input conductance of said second network when the output of said first network and the output of said second network are each terminated by an impedance of $Z_L/2$;

(k) an input impedance of said first network in parallel combination with an input impedance of said second network being equal to the complex conjugate of said unbalanced impedance $Z_0$ when the output of said first network and the output of said second network are each terminated by an impedance of $Z_L/2$;

(l) a dielectric substrate having first and second opposed, substantially parallel surfaces;

(m) said first network and said second network being positioned upon said first surface of said substrate;

(n) a planar ground conductor disposed on said second surface of said substrate;

(o) said first network including a microstrip transmission line disposed on said first surface of said substrate;

(p) said balanced impedance $Z_L$ and said unbalanced impedance $Z_0$ being related substantially by $Z_L = 4Z_0$; and (q) said microstrip transmission line having a characteristic impedance of $2Z_0$.

16. A balun as set forth in claim 15 wherein:

(a) said microstrip transmission line is disposed in a folded, back-and-forth pattern on said first surface of said substrate.

* * * * *